(12) United States Patent
Sato

(10) Patent No.: US 9,318,298 B2
(45) Date of Patent: Apr. 19, 2016

(54) ION GENERATOR AND ION GENERATING METHOD

(71) Applicant: Sumitomo Heavy Industries Ion Technology Co., Ltd., Tokyo (JP)

(72) Inventor: Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/536,946

(22) Filed: Nov. 10, 2014

(65) Prior Publication Data

US 2015/0129775 A1    May 14, 2015

(30) Foreign Application Priority Data

Nov. 13, 2013    (JP) ................. 2013-235312

(51) Int. Cl.
| | | |
|---|---|---|
| *G21K 5/00* | (2006.01) | |
| *H01J 27/08* | (2006.01) | |
| *H01J 37/08* | (2006.01) | |
| *H01J 37/317* | (2006.01) | |

(52) U.S. Cl.
CPC ............. *H01J 27/08* (2013.01); *H01J 37/08* (2013.01); *H01J 37/3171* (2013.01); *H01J 2237/31705* (2013.01)

(58) Field of Classification Search
USPC ....... 315/111.01, 111.81, 111.91; 250/423 R, 250/424, 426, 427
See application file for complete search history.

(56) References Cited

U.S. PATENT DOCUMENTS

| | | |
|---|---|---|
| 4,883,969 A | 11/1989 | Ishida et al. |
| 5,962,858 A | 10/1999 | Gwinn |
| 7,655,931 B2 | 2/2010 | Gupta |
| 2009/0309041 A1* | 12/2009 | Kurunczi ............ H01J 27/08 250/423 R |

FOREIGN PATENT DOCUMENTS

| | | |
|---|---|---|
| JP | 2530434 B2 | 9/1996 |
| JP | H11-087261 A | 3/1999 |
| JP | 3516262 B2 | 4/2004 |
| JP | 2010-522966 A | 7/2010 |

* cited by examiner

*Primary Examiner* — Nicole Ippolito
(74) *Attorney, Agent, or Firm* — Michael Best & Friedrich LLP

(57) ABSTRACT

An ion generator is provided with: an arc chamber that is at least partially made up of a material containing carbon; a thermal electron emitter that emits thermal electrons into the arc chamber; and a gas introducer that introduces a source gas and a compound gas into the arc chamber. The source gas to be introduced into the arc chamber contains a halide gas, and the compound gas to be introduced into the arc chamber contains a compound having carbon atoms and hydrogen atoms.

13 Claims, 6 Drawing Sheets

ION GENERATOR AND ION GENERATING METHOD

BACKGROUND OF THE INVENTION

1. Field of the Invention

The present invention relates to an ion generator and an ion generating method.

2. Description of the Related Art

In a semiconductor manufacturing process, a process of implanting ions into a semiconductor wafer has been implemented on a standard basis for the purpose of changing conductivity, for the purpose of changing a crystal structure of the semiconductor wafer, and for some other purpose. An apparatus used in this process is generally called an ion implanter.

As an ion source in such an ion implanter, a direct current (DC)-discharge type ion source is known. A DC-discharge type ion source heats a filament by a DC current to generate thermal electrons, and a cathode is heated by the thermal electrons. Then, thermal electrons emitted from the heated cathode are accelerated into an arc chamber and collided with source gas molecules introduced thereinto, to ionize atoms contained in the source gas molecules.

For the source gas molecules to be introduced into the arc chamber, a halide such as a fluoride or a chloride is often used. The source gas molecules of the halide generate halogen radicals in an ionization step, and the halogen radicals act on a component constituting the ion source, such as a metal material for an inner wall of the arc chamber, to form a chemical bond. Then the chemically bonded metal material is easily vaporized and ionized along with the source gas molecules, and extracted as an ion beam from the ion source with the desired ions.

This might result in that the metal material for the inner wall of the arc chamber is implanted as ions into a semiconductor wafer, leading to contamination of the wafer by impurity ions of the metal or the like. Especially in the case of the DC-discharge type ion source, a high melting point metal such as molybdenum (Mo), tungsten (W) or tantalum (Ta) may be used for the inner wall of the arc chamber since a temperature in the arc chamber becomes high. Metal contamination by such a high melting point metal is desired to be reduced as much as possible for improvement in performance of a semiconductor device.

Accordingly, there has been considered a configuration where carbon is used instead of the foregoing high melting point metal as a member for the wall of the arc chamber. However, highly reactive radicals, originated from the halide generated in the ionization step, easily cause wear of carbon. Further, when the carbon ions and neutrals having scattered are deposited onto arc chamber and beam extraction parts and becomes a conductive film, it brings about an insulation failure. Therefore, life of the ion source becomes significantly short, and the productivity of the implanter deteriorates.

SUMMARY OF THE INVENTION

The present invention was made in view of such circumstances, and an object of the present invention is to provide a technique for reducing contamination by heavy metal ions in ion implantation and generating ions with high productivity.

In order to solve the above problem, an ion generator according to one aspect of the present invention is provided with: an arc chamber that is at least partially made up of a material containing carbon; a thermal electron emitter that emits thermal electrons into the arc chamber; and a gas introducer that introduces a source gas and a compound gas into the arc chamber. The source gas to be introduced into the arc chamber contains a halide gas, and the compound gas to be introduced into the arc chamber contains a compound having carbon atoms and hydrogen atoms.

Another aspect of the present invention is an ion generating method. This method is provided with: introducing a source gas and a compound gas into an arc chamber that is at least partially made up of a material containing carbon; emitting thermal electrons into the arc chamber; generating plasma by collision between the source gas and the thermal electrons; and extracting ions from the plasma to the outside. The source gas to be introduced into the arc chamber contains a halide gas, and the compound gas to be introduced into the arc chamber contains a compound having carbon atoms and hydrogen atoms.

It is to be noted that one obtained by replacing arbitrary combination of the above constituent elements or expression of the constitutional element of the present invention among a method, an apparatus, a system and the like is also effective as an aspect of the present invention.

DETAILED DESCRIPTION OF THE INVENTION

The invention will now be described by reference to the preferred embodiments. This does not intend to limit the scope of the present invention, but to exemplify the invention.

Hereinafter, the mode for carrying out the present invention will be described in detail with reference to the drawings. It is to be noted that the same element is provided with the same numeral in descriptions of the drawings, and a repeated description is omitted as appropriate. Further, a configuration described below is illustrative and is not to restrict the scope of the present invention.

Figure 1:
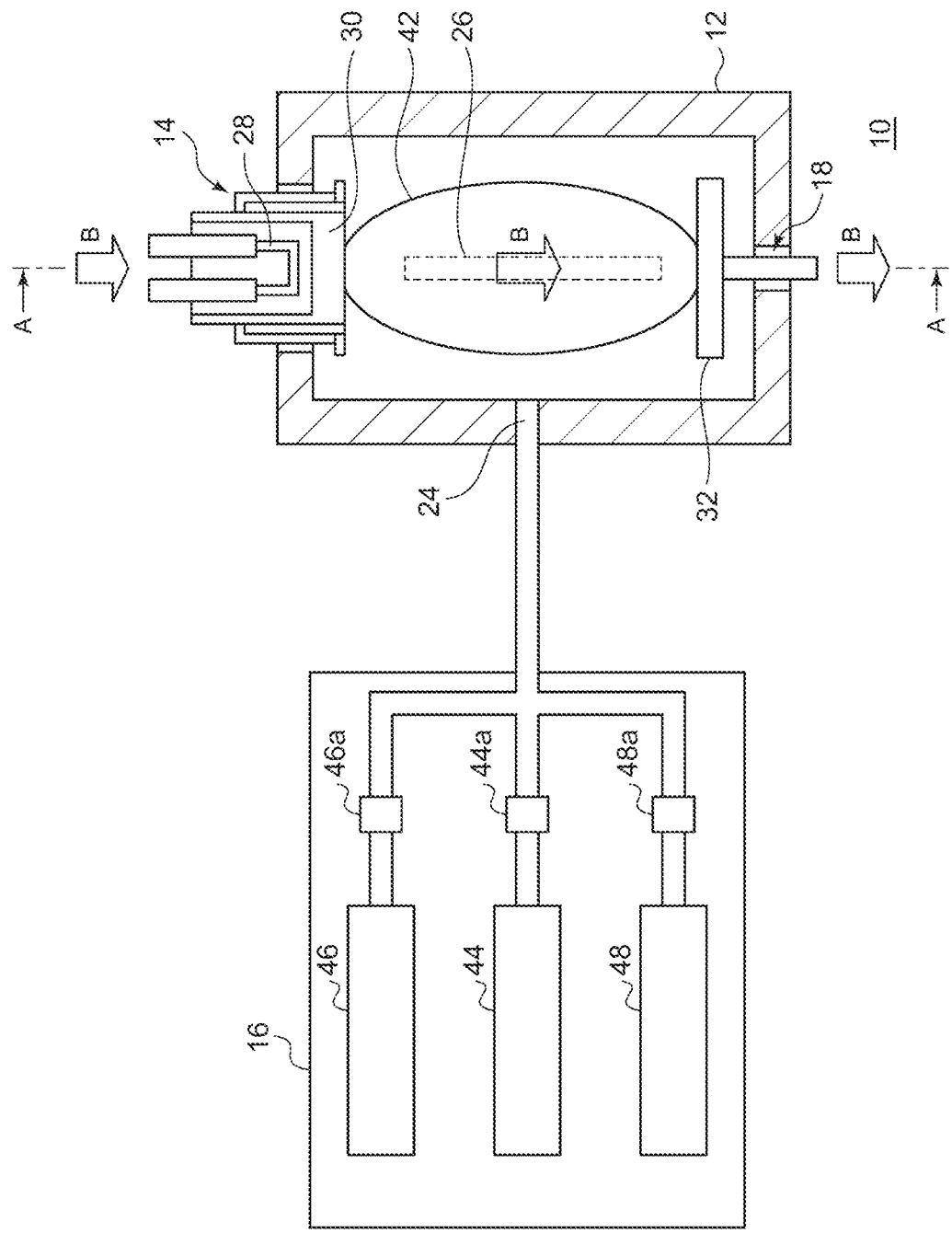
FIG. 1 is a schematic diagram showing a gas box and the inside of an arc chamber of an ion source according to the present embodiment.
Figure 2:
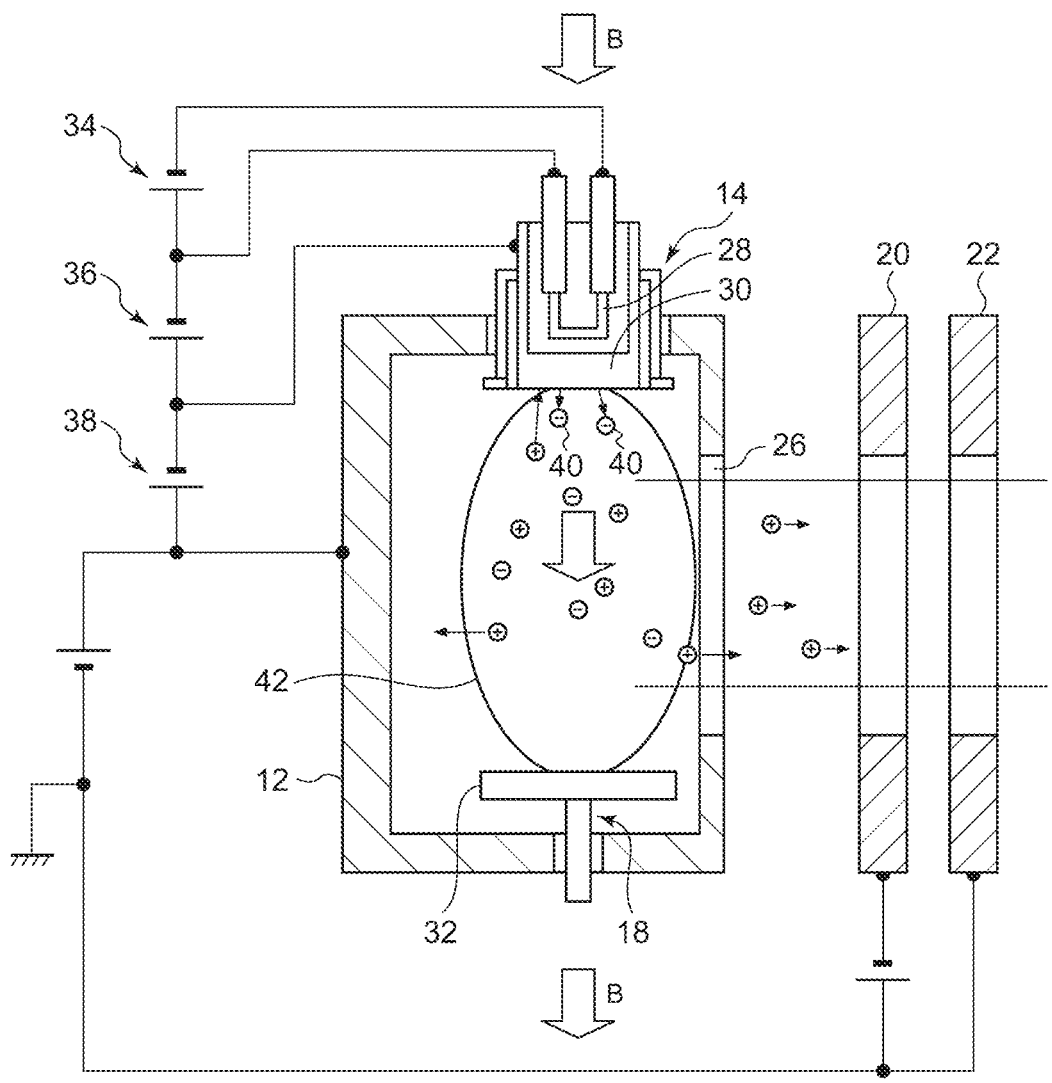
FIG. 2 is a schematic diagram showing an A-A cross section of the ion source shown in FIG. 1.

FIG. 1 is a schematic diagram showing a gas box and the inside of an arc chamber of an ion source according to the present embodiment. FIG. 2 is a schematic diagram showing an A-A cross section of the ion source shown in FIG. 1.

An ion generator 10 according to the present embodiment is a DC-discharge type ion source, and provided with an arc chamber 12, a thermal electron emitter 14, a repeller 18, a suppression electrode 20, a ground electrode 22, and a variety of power supplies.

The arc chamber 12 is formed with a gas introducing port 24 that introduces a source gas, and a front slit 26 as an opening from which an ion beam is extracted.

The thermal electron emitter 14 serves to emit thermal electrons into the arc chamber, and has a filament 28 and a cathode 30. The repeller 18 is provided in a position opposed to the thermal electron emitter 14, and has a repeller plate 32. The cathode 30 and the repeller plate 32 are provided almost in parallel as opposed to each other.

The filament 28 is heated by a filament power supply 34, to emit thermal electrons from its tip. The (primary) thermal electrons emitted from in the filament 28 is accelerated by a cathode power source 36 and collided with the cathode 30, and heats the cathode 30 by heat generated at the time of the collision. The heated cathode 30 emits (secondary) thermal electrons 40, and these (secondary) thermal electrons 40 are accelerated by an arc voltage, applied to between the cathode 30 and the arc chamber 12 by an arc power supply 38, and emitted into the arc chamber 12 as beam electrons having sufficient energy for ionizing gas molecules.

Meanwhile, the ion generator 10 is applied with an external magnetic field B induced by a source magnetic field coil in a direction of an axis connecting the cathode 30 and the repeller 18 which repels the beam electrons toward the cathode 30. Further, since the repeller 18 is provided as opposed to the cathode 30 that emits the beam electrons, the beam electrons reciprocate between the cathode 30 and the repeller 18 along the magnetic field B, and perform ionization by collision with source gas molecules introduced into the arc chamber 12, to generate ions and generate a plasma 42 in the arc chamber 12. Since the beam electrons exist in a range almost restricted by the applied magnetic field, the ions are mainly generated in that range, reach an inner wall of the arc chamber 12, the front slit 26, the cathode 30 and the repeller 18 by diffusion, and are then lost on the wall surface.

The ion generator 10 according to the present embodiment is a DC-discharge type ion source that emits the (secondary) thermal electrons 40, and a temperature inside the arc chamber 12 becomes very high. For this reason, the arc chamber 12 is made up of a high melting point material, specifically a high melting point metal of W, Mo or Ta, an alloy of those, graphite (C) or the like. Therefore, even in an environment where the temperature becomes relatively high in the arc chamber such as in the DC discharge-type ion source, the arc chamber can be made resistant to melting.

As the source gas, there is used a noble gas, a hydride such as hydrogen ($H_2$), phosphine ($PH_3$) or arsine ($AsH_3$), or a halide like a fluoride such as boron trifluoride ($BF_3$) or germanium tetrafluoride ($GeF_4$), or a chloride such as indium trichloride ($InCl_3$). The above source gas is introduced into the arc chamber 12 and ionized by the (secondary) thermal electrons 40. However, when the induced ions are incident on and collided with the inner wall of the arc chamber 12, the front slit 26, the cathode 30 and the repeller 18, they cause wear of a constituent material (W, Ta, Mo, graphite, etc .) for each of the sections by sputtering or chemical etching. Further, in a case where the source gas is a fluoride, e.g., $BF_3$, when $BF^+$, $BF_2^+$, $F^+$ or $F_2^+$ is generated by ionization and the ions are neutralized on the wall surface in the arc chamber 12, highly reactive fluorine radicals such as F or $F_2$ are generated.

The fluorine radicals are chemically bonded with the material for the component constituting the ion generator 10, and become a fluoride such as $WF_x$, $TaF_x$, $MoF_x$ or $CF_x$. Since the above fluoride is gasified at a relatively low temperature, it is ionized in the arc chamber along with the introduced source gas, and extracted as an ion beam of $W^+$, $Ta^+$, $Mo^+$ or the like along with a main ion beam of the introduced source gas.

Meanwhile, in the recent ion implantation, it has been strictly required to reduce metal contamination caused by ions of a heavy metal such as a high melting point metal ($W^+$, $Ta^+$, $Mo^+$, etc.) in order to improve performance of the semiconductor device. However, it is not preferable that fluorine contained in the ion source gas is chemically bonded with the high melting point material for the arc chamber 12 or the like which constitutes the ion source to be gasified and ionized, and is then extracted as unnecessary impurity ions from the arc chamber 12 as described above.

Further, while the heavy metal ions extracted as the ion beam are deposited in a beamline, part of those ions reach an ion implanting section to bring about heavy metal contamination of the wafer into which ions are implanted, leading to deterioration in product yield of the semiconductor device. Moreover, while the fluorine radicals cause wear of the constituents (cathode, repeller, front slit, arc chamber, etc.) of the high-temperature ion source in a short time period, they are deposited on part of the high-temperature members, to bring about problems such as an insulation failure. Hence it is necessary to frequently replace each component, which increases maintenance frequency of the ion source and the ion implanter provided with the ion source, leading to deterioration in productivity thereof.

Figure 3:
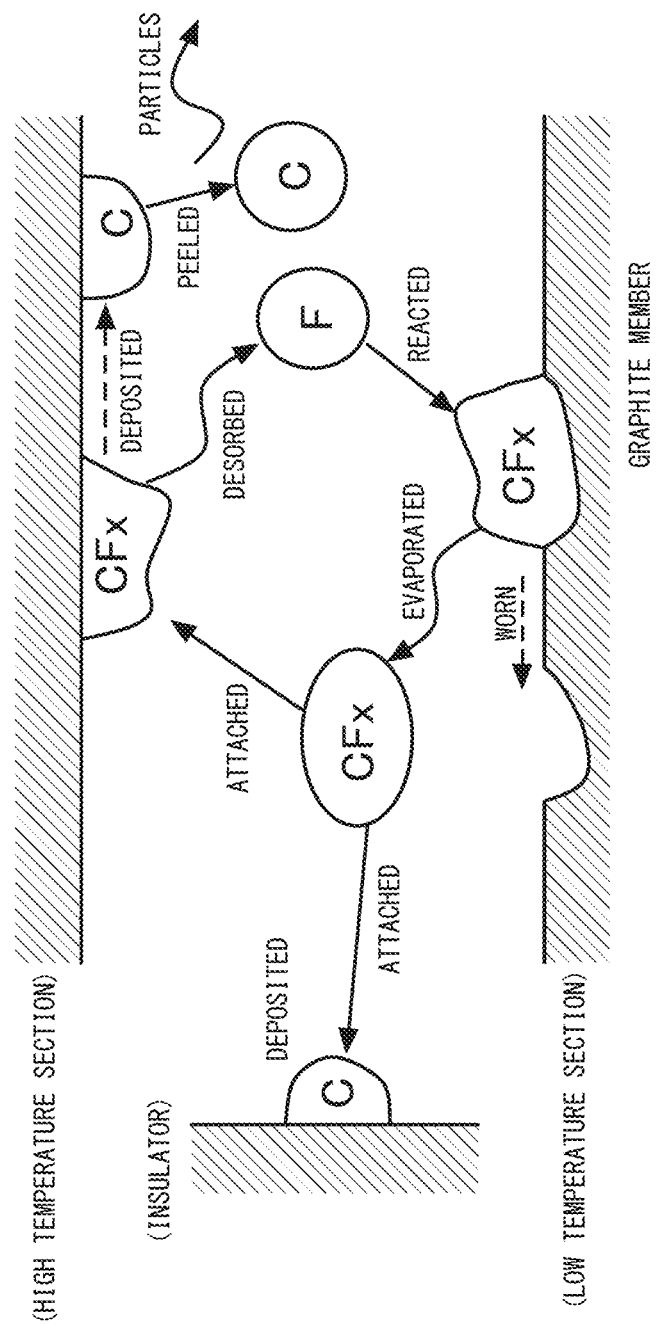
FIG. 3 is a schematic diagram for explaining wear and deposition reactions that occur in the carbon source.

The foregoing phenomenon will be described in more detail. FIG. 3 is a schematic diagram for explaining wear and deposition reactions that occur in the carbon source. As shown in FIG. 3, fluorine radicals with especially high reactivity are adsorbed (attached) to the wall of the arc chamber, and chemically bonded with the wall surface member (W, Mo, Ta, C, etc.), to generate $WF_x$, $MoF_x$, $TaF_x$, $CF_x$ or the like. Since the above fluoride is gasified at a relatively low temperature not higher than a several hundred degrees, they are vaporized (evaporated) from the wall surface of the source whose temperature reaches 1000° C. or higher at the time of operation, to cause wear of the inner wall of the source. The vaporized fluoride is thermally decomposed around the cathode or on the surface of the repeller, where a temperature is still higher, to dissociate (desorb) fluorine, and W, Mo, Ta, C or the like is then deposited. A so-called halogen cycle occurs.

When the wear and deposition by the fluorine radicals occur in the arc chamber, as described above, an insulation failure or beam performance deterioration occurs due to a change in member shape, a decrease in initial gap, or the like. In particular, high-temperature graphite (carbon) easily reacts with fluorine to become $CF_x$ as a gaseous body. It is then mixed with the source gas and ionized in the arc chamber, to generate a large amount of carbon ions. A large amount of the carbon ions are extracted as a beam, causing deterioration in beam extraction efficiency of the desired ion beam. Further, they are attached to the surface of an insulator such as an insulator of an extraction electrode, to bring about the insulation failure in a short time period, thereby producing the need for frequent maintenance such as replacement of the insulator.

Accordingly, the present inventor conducted intensive studies, and as a result conceived the following technique. That is, the present inventor conceived that highly reactive radicals originated from a halide such as a fluoride or a chloride as a compound generated in the high-temperature ion source are efficiently reduced so as not to be chemically bonded with the arc chamber 12 which constitutes the ion source and is made up of a high melting point metal or carbon (graphite), thereby allowing suppression of generation of the heavy metal ions and wear of the carbon member. Further, with this technique, it is possible to suppress wear of the components constituting the ion generator 10, which include the arc chamber 12 using carbon (graphite), so as to extend life of the ion generator 10.

Specifically, the ion generator 10 according to the present embodiment is provided with: the arc chamber 12 that is at least partially made up of a material containing carbon; the thermal electron emitter 14 that emits thermal electrons into the arc chamber 12; and the gas introducing port 24 that introduces a source gas and a compound gas into the arc chamber 12. The source gas to be introduced into the arc chamber 12 contains a halide gas, and the compound gas to be introduced into the arc chamber contains a compound having carbon atoms and hydrogen atoms.

Further, a gas box 16 is connected to the gas introducing port 24. The gas box 16 accommodates a source gas bottle 44 filled with the source gas, a compound gas bottle 46 filled with a hydrocarbon compound gas as the compound having carbon atoms and hydrogen atoms, and a noble gas bottle 48 filled with a noble gas. Further, flow channels from the respective bottles toward the gas introducing port 24 are provided with gas controllers 44a, 46a, 48a that adjust gas flow amounts, and a mixture ratio and concentrations of the respective gases can be adjusted.

Then, in the arc chamber 12 of the ion generator 10, the source gas is ionized, and part of the ions change to halogen radicals. However, the halogen radicals are bonded with the hydrogen atoms contained in the compound gas to become a hydrogen compound, whereby a reaction with the member constituting the arc chamber is suppressed, and wear of the member is suppressed.

Further, a hydrogen gas itself may be used as a supply source of the hydrogen atoms. However, since having very wide explosion limits, the hydrogen gas is difficult to treat and a facility therefor tends to cost high. On the other hand, as compared to the hydrogen gas, the hydrocarbon compound gas has narrower explosion limits and is relatively easier to treat, allowing easier supply of hydrogen into the arc chamber 12. In particular, hydrocarbon is preferably at least one sort of gases selected from the group consisting of methane ($CH_4$), ethane ($C_2H_6$), propane ($C_3H_8$) and butane ($C_4H_{10}$). This enables relatively safe supply of hydrogen into the arc chamber. Especially, $CH_4$ is easy to treat since it has narrow explosion limits of 5.3 to 14% and is used also as a domestic fuel.

As the gas to fill the source gas bottle 44, a halide gas is preferably used. Specifically, there can be cited fluoride gases of $BF_3$, $GeF_4$, $PF_3$ and the like, chloride gases of $InCl_3$ and the like, iodide gases of InI and the like, and bromide gases of InBr and the like. The In compounds are supplies by heating for vaporization because foregoing In compounds are solid substances at normal temperature.

It is to be noted that the surface of the inner wall of the arc chamber 12, excluding the filament 28 and the cathode 30, may be made up of carbon. It is thereby possible to further reduce contamination of heavy metal ions due to ion implantation as compared to a case where a high melting point metal such as Mo, W or Ta is used for the inner wall of the arc chamber.

Figure 4:
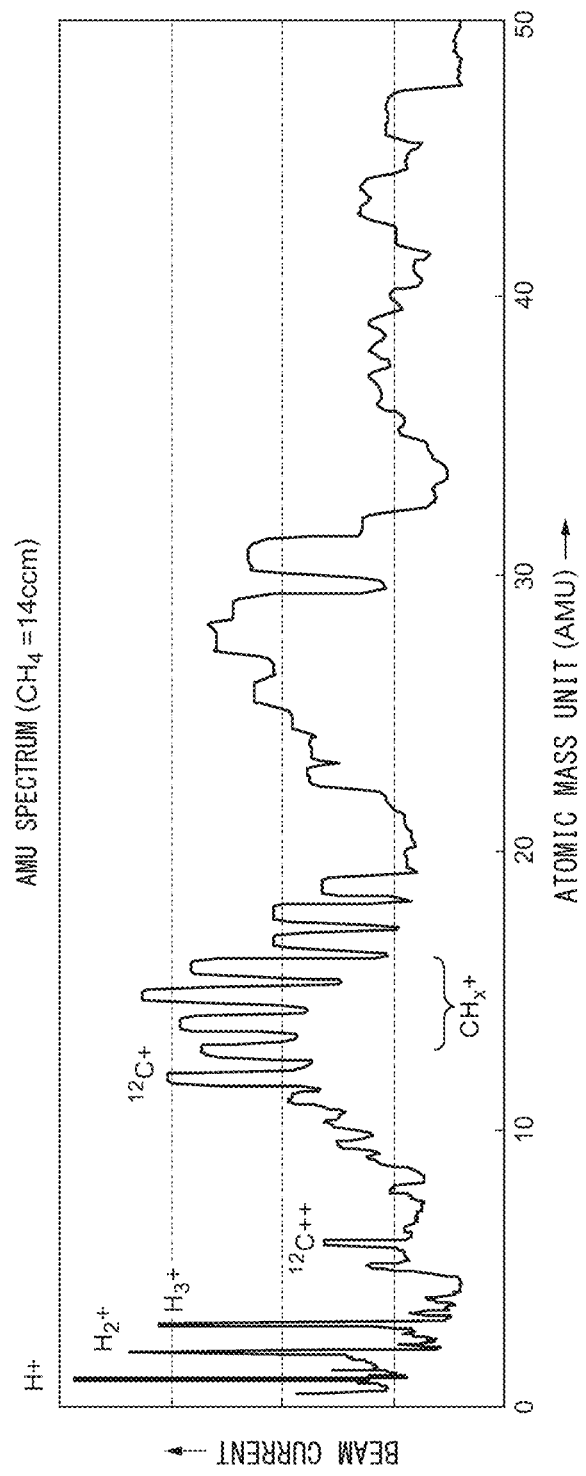
FIG. 4 is a diagram showing a beam spectrum in the case of introducing only a methane gas into the arc chamber and ionizing it.

Next, the effect of introducing hydrocarbon will be described. FIG. 4 is a diagram showing a beam spectrum in the case of introducing only a methane gas into the arc chamber and ionizing it.

Since $CH_4$ has low ionization energy and is thus easily ionized, it is found as shown in FIG. 4 that a peak of Hx+ is very large and a large amount of hydrogen ions exist. On the other hand, since halogen such as fluorine is easily reacted with hydrogen to generate a gaseous hydrogen compound at normal temperature, when hydrocarbon containing a large amount of hydrogen atoms is introduced as the compound gas, highly reactive fluorine (halogen) radicals which are generated at the time of ionizing a fluoride or the like can be reacted with hydrogen and efficiently exhausted as a hydrogen compound gas. Therefore, a reaction between fluorine and the constituent material (e.g., carbon) of the arc chamber is suppressed, and generation of a fluoride such as CFx or WFx is reduced.

Figure 5:
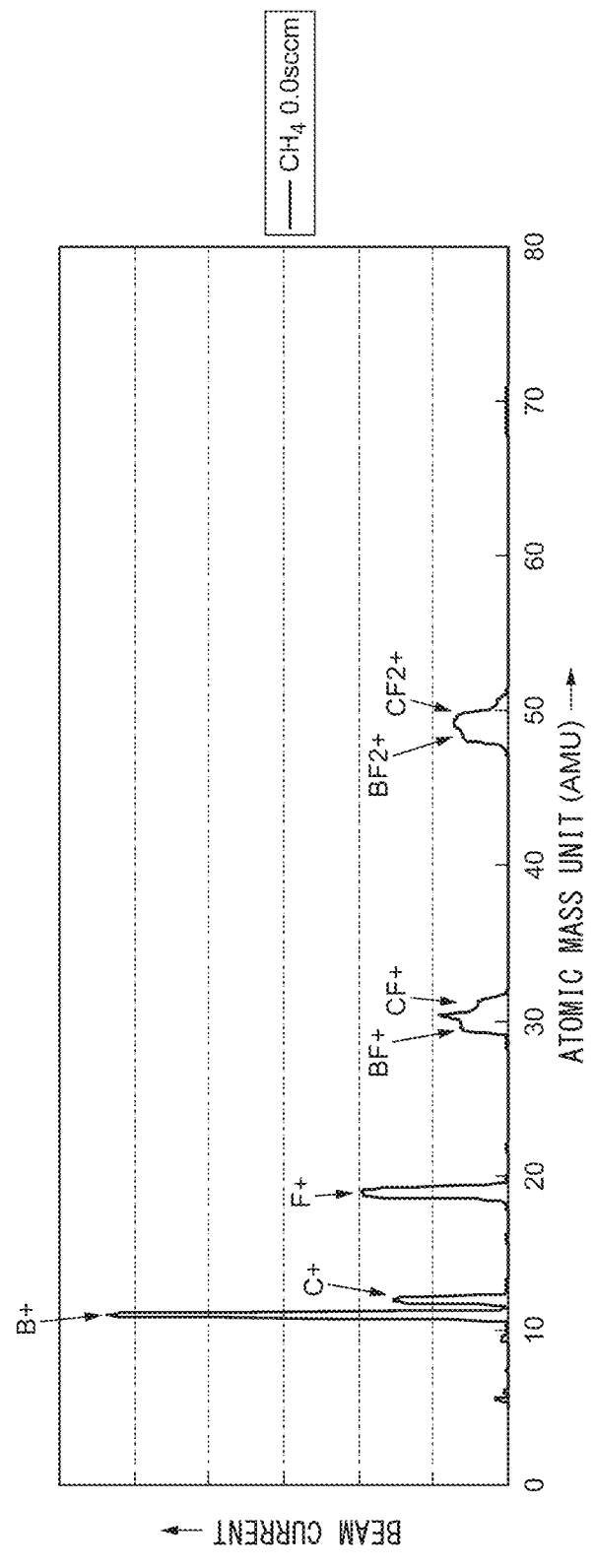
FIG. 5 is a diagram showing a beam spectrum in the case of introducing a $BF_3$ gas into an ion generator with the arc chamber made up of graphite (carbon) and ionizing it.
Figure 6:
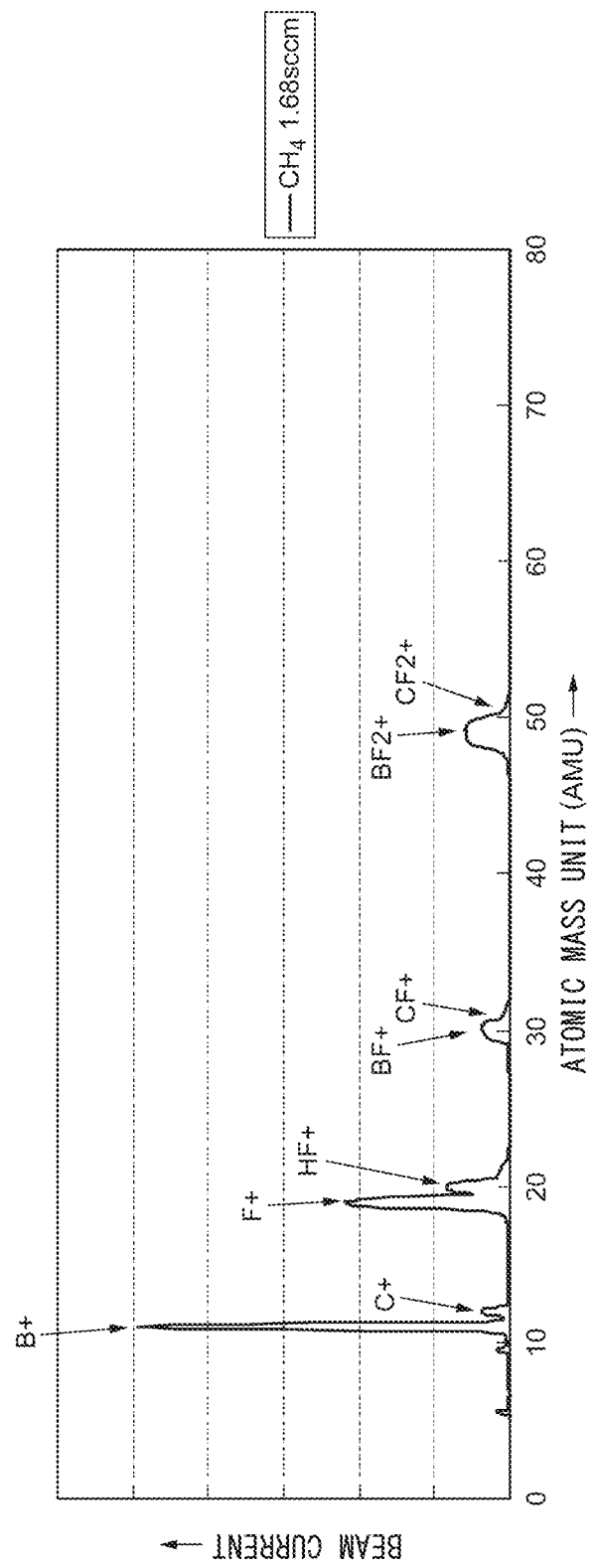
FIG. 6 is a diagram showing a beam spectrum in the case of introducing a methane gas in addition to the $BF_3$ gas into the ion generator with the arc chamber made up of graphite (carbon) and ionizing it.

FIG. 5 is a diagram showing a beam spectrum in the case of introducing only a $BF_3$ gas into the ion generator with the arc chamber made up of graphite (carbon) and ionizing it. FIG. 6 is a diagram showing a beam spectrum in the case of introducing a methane gas in addition to the $BF_3$ gas into the ion generator with the arc chamber made up of graphite (carbon) and ionizing it.

As shown in FIG. 5, peaks of C+, F+ and CFx+ are large, and it is estimated that carbon of the arc chamber has been worn by F and become a CFx gas, to be ionized. On the other hand, as shown in FIG. 6, in the case of introducing $CH_4$ as the compound gas with a flow amount of 1.68 sccm, the peak of C+ has been reduced to one third, the peak of HF+ has been increased, and it is thus found that fluorine has been efficiently removed. Further, CHx+ (a relative molecular weight is about 13 to 16) which is generated at the time of ionizing $CH_4$ as shown in FIG. 4 is hardly seen in FIG. 6, and it is thus found that hydrogen contained in CHx+ has been reacted with fluorine.

As described above, in the case of using a halide such as a fluoride or a chloride as the source gas, by simultaneously introducing gaseous hydrocarbon (methane, ethane, propane, butane, etc.) as the compound gas at a normal temperature into the plasma chamber to form a plasma, a large number of hydrogen atoms contained in hydrocarbon are easily reacted with halogen, and exhausted as a gas of a hydride (hydrogen halide) such as a hydrogen fluoride or a hydrogen chloride. Therefore, halogen in the arc chamber can be efficiently exhausted to the outside.

For this reason, while wear of graphite constituting the arc chamber is greatly reduced, carbon fluoride ions or carbon chloride ions decrease, thus suppressing deposition of carbon onto the high temperature section and attachment of the conductive film to the insulating matter, and extending life of the ion generator. Further, since one molecule of hydrocarbon contains a large number of hydrogen atoms, hydrocarbon is more efficiently used for introducing hydrogen atoms than hydrogen.

As thus described, by introducing the compound gas that contains hydrogen along with the source gas, wear of the beam extracting slit of the arc chamber 12 is reduced and its shape is held for a long time period, thereby suppressing deterioration in beam properties. Further, with the ionized fluoride gas decreasing, extraction of metal ions and carbon ions decrease, thereby reducing metal contamination and extending life of the extraction electrode.

When the foregoing description is taken as the ion generating method, this method is provided with: introducing a source gas and a compound gas into an arc chamber that is at least partially made up of a material containing carbon; emitting thermal electrons into the arc chamber; generating a plasma by collision between the source gas and the thermal electrons; and extracting ions from the plasma to the outside. The source gas to be introduced into the arc chamber contains a halide gas, and the compound gas to be introduced into the arc chamber contains a compound having carbon atoms and hydrogen atoms.

Hence the source gas is ionized in the arc chamber, and part of the ions change to halogen radicals. However, the halogen radicals are bonded with the hydrogen atoms contained in the compound gas to become a hydrogen compound, whereby a reaction with the member constituting the arc chamber is suppressed, and wear of the member is suppressed. It is to be noted that at the time of generating the plasma, a temperature in the arc chamber 12 is preferably not lower than 600° C. Further, a noble gas may be introduced from the gas box 16 in addition to the source gas and the compound gas. The noble gas is argon (Ar), neon (Ne), xenon (Xe) or the like.

Although the present invention has been described with reference to the foregoing embodiment, the present invention is not restricted to the foregoing embodiment. One obtained by appropriately combining or replacing the configuration of the embodiment as appropriate is also included in the present invention. Further, it is also possible to appropriately change the combination or the order of processes in the embodiment or add a variety of modifications such as a design change to the embodiment based on knowledge of a skilled person in the art, and the embodiment added with such a modification can be included in the scope of the present invention.

The gas bottles provided in the gas box 16 are not necessarily separated as three bottles as described above, but the two bottles that are the source gas bottle 44, where the source gas and the compound gas are mixed at a predetermined concentration ratio, and the noble gas bottle 48 may be used. Further, the two bottles that are the compound gas bottle 46, where the noble gas and the compound gas are mixed at a predetermined concentration ratio, and the source gas bottle 44 may be used.

Moreover, the thermal electron emitter 14 may be an electron-collision type ion source that directly performs ionization by (primary) thermal electrons emitted from the filament, or an indirectly heated electron-collision type ion source that collides the (primary) thermal electrons emitted from the filament with a cathode cap and performs ionization by the (secondary) thermal electrons 40 emitted from the cathode cap.

Priority is claimed to Japanese Patent Application No. 2013-235312, filed Nov. 13, 2013, the entire content of which is incorporated herein by reference.

What is claimed is:

1. An ion generator comprising:
   an arc chamber that is at least partially made up of a material containing carbon;
   a thermal electron emitter configured to emit thermal electrons into the arc chamber; and
   a gas introducer configured to introduce a source gas and a compound gas into the arc chamber, wherein
   the source gas to be introduced into the arc chamber contains a halide gas,
   the compound gas to be introduced into the arc chamber contains a compound having carbon atoms and hydrogen atoms, and
   the compound gas is hydrocarbon.

2. The ion generator according to claim 1, wherein the hydrocarbon is at least one sort of gases selected from the group consisting of $CH_4$, $C_2H_6$, $C_3H_8$ and $C_4H_{10}$.

3. The ion generator according to claim 1, wherein the source gas contains a fluoride gas.

4. The ion generator according to claim 3, wherein the fluoride gas is at least one sort of gases selected from the group consisting of $BF_3$, $GeF_4$ and $PF_3$.

5. The ion generator according to claim 1, wherein the source gas is at least one sort of gases selected from the group consisting of a chloride gas, an iodide gas and a bromide gas.

6. The ion generator according to claim 1, wherein an inner wall surface of the arc chamber, excluding a filament and a cathode, is made up of carbon.

7. An ion generating method comprising:
   introducing a source gas and a compound gas into an arc chamber that is at least partially made up of a material containing carbon;
   emitting thermal electrons into the arc chamber;
   generating a plasma by collision between the source gas and the thermal electrons; and
   extracting ions from the plasma to the outside, wherein
   the source gas to be introduced into the arc chamber contains a halide gas,
   the compound gas to be introduced into the arc chamber contains a compound having carbon atoms and hydrogen atoms, and
   the compound gas is a hydrocarbon.

8. The ion generating method according to claim 7, wherein a temperature in the arc chamber is not lower than 600° C. in the generation step.

9. The ion generating method according to claim 7, wherein the hydrocarbon is at least one sort of gases selected from the group consisting of $CH_4$, $C_2H_6$, $C_3H_8$ and $C_4H_{10}$.

10. The ion generating method according to claim 7, wherein the source gas contains a fluoride gas.

11. The ion generating method according to claim 10, wherein the fluoride gas is at least one sort of gases selected from the group consisting of $BF_3$, $GeF_4$ and $PF_3$.

12. The ion generating method according to claim 7, wherein the introduction step introduces a noble gas in addition to the source gas and the compound gas.

13. The ion generating method according to claim 7, further comprising exhausting halogen element contained in the halide gas as a hydrogen halide.

* * * * *